United States Patent [19]

Thillays

[11] Patent Number: 5,148,039
[45] Date of Patent: Sep. 15, 1992

[54] PHOTOCOUPLER HOUSING SUITABLE FOR SURFACE MOUNTING TO A CIRCUIT BOARD

[75] Inventor: Jacques C. Thillays, Herouville, France

[73] Assignee: U.S. Philips Corporation, New York, N.Y.

[21] Appl. No.: 623,869

[22] Filed: Dec. 3, 1990

[30] Foreign Application Priority Data

Dec. 29, 1989 [FR] France ............................ 89 17453

[51] Int. Cl.⁵ .............................................. G02B 27/00
[52] U.S. Cl. ....................................... 250/551; 250/239
[58] Field of Search ............... 250/551, 239; 357/19; 307/311

[56] References Cited

U.S. PATENT DOCUMENTS

| | | | |
|---|---|---|---|
| 3,822,384 | 7/1974 | Chapron et al. | 250/551 |
| 4,054,801 | 10/1977 | Breval et al. | 250/239 |
| 4,095,116 | 6/1978 | Felkel et al. | 250/551 |
| 4,131,905 | 12/1978 | Hanes et al. | 357/30 |
| 4,207,587 | 6/1980 | Hanes et al. | 357/74 |
| 4,268,756 | 5/1981 | Crouse et al. | 250/239 |
| 4,977,317 | 12/1990 | Iwashima | 250/239 |

Primary Examiner—David C. Nelms
Assistant Examiner—Que T. Le
Attorney, Agent, or Firm—William L. Botjer

[57] ABSTRACT

The invention relates to a photocoupler for surface mounting. The device includes a first support (20), a phototransmitter element, a second support (20') having a photoreceiver element, and an electrically insulating assembly housing (1) in which the first and the second supports (20, 20') are assembled together by snap connections (11, 12) in a longitudinal direction of the assembly housing in such a way that the phototransmitter element and the photoreceiver element face on another. The first and the second support (20, 20') have a lateral surface (26) provided with conductor tracks (22, 24) in electrical contact with the said respective elements to enable surface mounting.

12 Claims, 1 Drawing Sheet

1

PHOTOCOUPLER HOUSING SUITABLE FOR SURFACE MOUNTING TO A CIRCUIT BOARD

BACKGROUND OF THE INVENTION

The invention relates to a photocoupler for surface mounting.

Photocouplers unite in a single housing a phototransmitter element and a photoreceiver element. Their function is the electric separation of circuits which exchange signals, while a principal element of their characteristics is the insulation voltage, the value of which depends on the distance separating the transmitter and the receiver. Therefore, the housings utilize supports with high electric insulation values, which are expensive (ceramics, etc.). It thus becomes expensive to increase the dimensions in order to increase the insulation voltage.

SUMMARY OF THE INVENTION

The invention has for its object to provide a photocoupler for surface mounting with a high insulation voltage which can be realised at a lower cost.

The photocoupler according to the invention is for this purpose characterized in that it comprises a first support carrying a phototransmitter element, a second support carrying a photoreceiver element, and an electrically insulating assembly housing in which the first and the second support are assembled together, preferably by a snap connection, in a longitudinal direction of the assembly housing, in such a way that the phototransmitter element and the photoreceiver element face one another, and in that the first and the second support have a lateral surface provided with conductor tracks in electrical contact with the said respective elements with a view to the said surface mounting.

The assembly housing fulfils a spacer function between the two supports, which allows of obtaining the high electrical insulation which is desired. On the other hand, the assembly housing is a low-cost component.

The assembly housing may comprise two parts which are assembled together in a transversal direction. This renders it possible to make the two assembled parts particularly simple to manufacture in a mould.

In a preferred embodiment, the assembly housing comprises at least one recess arranged to receive an assembly glue which has its object to keep the photocoupler flat against a circuit, for example a printed circuit, for a subsequent soldering step.

BRIEF DESCRIPTION OF THE DRAWINGS

The invention will be more readily understood through reading of the following description, which is given by way of nonlimitative example, with reference to the drawings in which.

DETAILED DESCRIPTION OF PREFERRED EMBODIMENT

Figure 1:
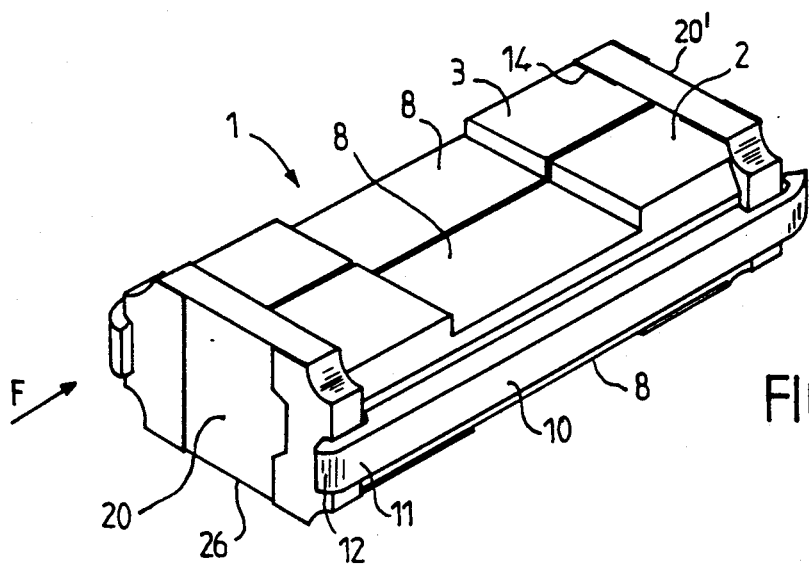
FIG. 1 shows a perspective view of a photocoupler according to the invention.
Figure 2A:
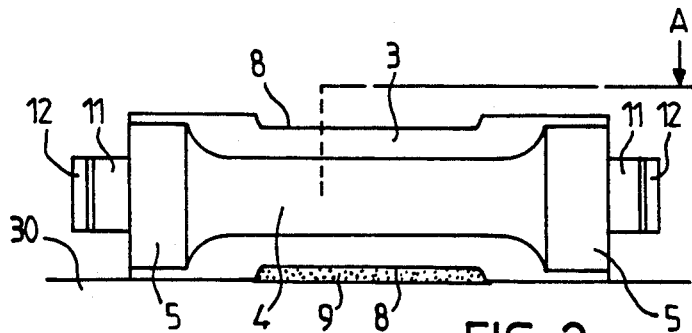
FIGS. 2a, 2b and 2c show one half of an assembly housing in side elevation, an assembly housing taken on BB in transversal cross-section, and a assembly housing in partial longitudinal section A, respectively.
Figure 2B:
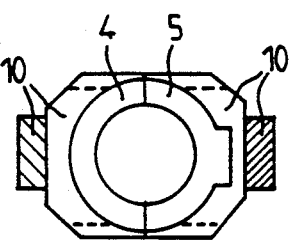
Figure 2C:
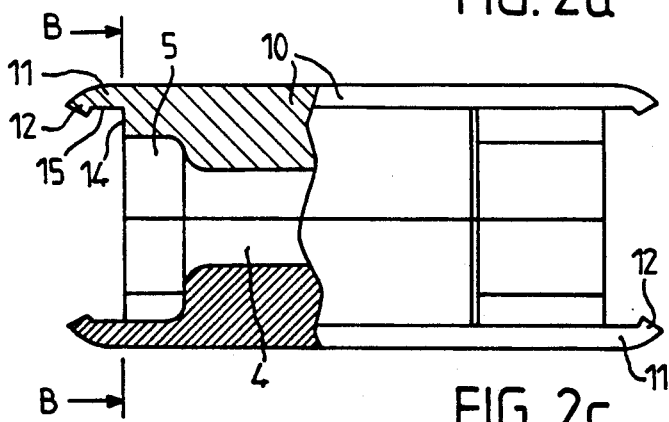

According to FIG. 1, an assembly housing 1 of elongate shape made of electrically insulating material comprises lateral surfaces 14 against which supports 20, 20' are held in abutment by means of snap connections 11, 12 upon assembly in a longitudinal direction along housing 1 (arrow F). One of the supports 20 comprises a phototransmitter element and the other support 20' comprises a photoreceiver element. The snap connection and the abutment make it possible to ensure that the optical axes of the two elements are practically the same. The assembly housing 1 comprises a central cylindrical or rectangular opening 4 for the passage of the light beams, which openings extend at the two longitudinal ends into two recesses 5 which can accommodate the elements and their electrical connections as well as their optical coupling elements, if applicable. The length of the assembly housing makes it possible to realise the desired electrical insulation voltage and is thus chosen to comply with this parameter. Moreover, the assembly housing 1 comprises on one of its upper or lower surfaces a recess 8 which can accommodate glue 9 to fix the photocoupler on a printed circuit 30 in view of a wave soldering operation for the contacts 22 and 24 of the supports 20, 20'.

Figure 3A:
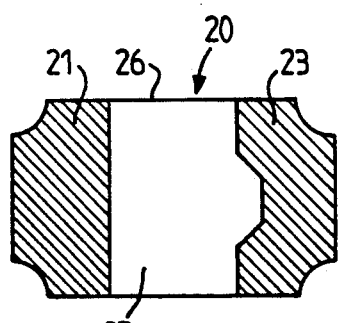
FIGS. 3a, 3b and 4 show a support in side elevation from the left, in side elevation from the right, and seen from below, respectively.
Figure 4:
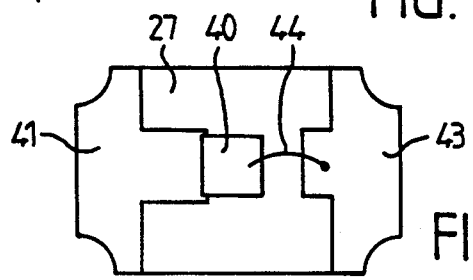
Figure 3B:
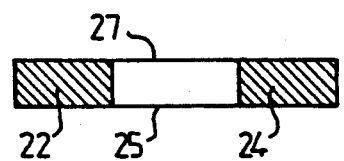

The supports 20, 20' are represented in more detail in FIGS. 3a, 3b and 4. An optoelectronic element 40, either a phototransmitter or a photoreceiver, is mounted on their upper surface 27, while their two electrodes are in electrical contact with two metallizations, one of which is in electrical contact with a metallization 22 of a lateral surface 26 and the other with a metallization 24 spaced apart from the metallization 22 on the same lateral surface 26. The bottom surface 25 of the support 20 may comprise metallizations 21 and 23 which are in electrical contact with the metallizations 22 and 24, respectively. The metallizations 21 and 23 may serve for testing purposes when the photocoupler is mounted, or they may alternatively serve as metallizations for surface mounting of a support 20 when used on its own, i.e. without housing 1.

The upper surface 27 of the support 20 comprises two metallizations 41 and 43 in electrical contact with the metallizations 22 and 24, respectively. An element 40 is in electrical contact by its bottom surface with the metallization 41. The second electrical connection of the element 40 is realised by a wire 44 between its upper surface and the metallization 43.

It should be noted that two recesses 8, one in the upper surface, the other in the bottom surface of the housing 1, are represented in the Figures. This has no other object than to position this housing symmetrically, especially in order to realise this housing in the form of two half housings 2 and 3 mutually separated along a longitudinal plane of housing 1, and capable of being readily assembled in a transversal direction. The construction of a housing 1 in the form of two half housings 2 and 3, manufactured, for example, by injection moulding of a synthetic material, is particularly economical in this way.

Moreover, the supports 20, 20' (made of, for example, ceramic material) may have reduced dimensions since they are not encumbered by the problems of a high insulation voltage between two elements, transmitter and receiver.

A high-performance photocoupler is thus obtained, which is easy to manufacture and inexpensive.

When the supports 20, 20' are assembled on the housing 1, they are kept clamped together at the abutment 14 by the snap connections 12 and laterally by the surfaces 15 of the snap connection arms 11. The metallizations 22 and 24 of the two supports 20, 20' are disposed in the same said bottom surface of the housing 1, which renders surface mounting possible.

Particularly suitable materials for the realisation of the assembly housing are, for example, a polyamide 4–6 charged with titanium oxide (known under the trade name STANYL of the Dutch firm DSM) or, alternatively, a so-called "liquid crystal" polymer charged with glass fibre and titanium oxide (known under the brand name VECTRA of the American CELANESE Company).

The central opening 4 may be reflecting and, in that case, preferably of cylindrical cross-section with a diameter adapted to a light-transmission function. An optoelectronic element 40 may be disposed in the focus of a lens in order to improve the luminous efficiency. The central opening 4, whether reflecting or not, may be filled with a transparent resin in order to increase the light-coupling function. The resin is preferably of a type fitted to fill the opening 4 through capillary action, for example the resin "Poréanche 290" from LOCTITE, which is ten more fluid than water. The resin has the additional advantage of fixing the support 20 in position by adhesion.

I claim:

1. A photocoupler comprising a first support carrying on a surface thereof a phototransmitter, a second support carrying on a surface thereof a photoreceiver element, and an electrically insulating housing in which the first and second supports are assembled in such a way that the faces on which the respective elements are provided face one another, wherein the first and second support are constructed from an electrically insulating material, are assembled on opposite sides of a longitudinal direction of the housing and have a lateral surface lying in an outer surface of the photocoupler on which lateral surface two conductor tracks are provided that are in electrical contact with the respective elements and which tracks permit the surface mounting of the photocoupler.

2. A photocoupler as claimed in claim 1, characterized in that the assembly takes place by means of a snap connection.

3. A photocoupler as claimed in claim 1, characterized in that the assembly housing comprises two parts assembled together in a transverse direction.

4. A photocoupler as claimed in claim 1, characterized in that the assembly housing comprises at least one recess arranged to receive an assembly glue which serves to keep the photocoupler flat against a circuit for a subsequent soldering step.

5. A photocoupler as claimed in claim 1, characterized in that at least one of the supports is made of ceramic material.

6. A photocoupler as claimed in claim 1, characterized in that the assembly housing is made of synthetic material.

7. A photocoupler as claimed in claim 6, characterized in that the said synthetic material is a polyamide 4–6 charged with titanium oxide.

8. A photocoupler as claimed in claim 6, characterized in that the said synthetic material is a polymer charged with glass fibres and titanium oxide.

9. A photocoupler as claimed in claim 1, characterized in that the assembly housing includes a central opening whose shape is adapted to function as a light conductor.

10. A photocoupler as claimed in claim 9, characterized in that the central opening is reflecting.

11. A photocoupler as claimed in claim 9, characterized in that the central opening is filled with a transparent resin.

12. A photocoupler as claimed in claim 1, characterized in that the first support is identical to the second support.

* * * * *